United States Patent [19]
Laskaris

[11] Patent Number: 5,045,826
[45] Date of Patent: Sep. 3, 1991

[54] ACTIVELY SHIELDED MAGNETIC RESONANCE MAGNET WITHOUT CRYOGENS

[75] Inventor: Evangelos T. Laskaris, Schenectady, N.Y.

[73] Assignee: General Electric Company, Schenectady, N.Y.

[21] Appl. No.: 504,822

[22] Filed: Apr. 5, 1990

[51] Int. Cl.$^5$ .............................................. H01F 7/22
[52] U.S. Cl. .................... 335/301; 335/299; 335/216; 335/302; 505/879; 174/15.4; 324/318
[58] Field of Search ............... 335/216, 217, 299, 300, 335/301, 302; 324/318, 319, 320; 505/879, 924, 885; 174/15.4

[56] References Cited

U.S. PATENT DOCUMENTS

| | | | |
|---|---|---|---|
| 4,771,256 | 9/1988 | Laskaris | 335/216 |
| 4,782,671 | 11/1988 | Breneman | 62/51.3 |
| 4,837,541 | 6/1989 | Pelc | 335/301 |
| 4,895,831 | 1/1990 | Laskaris | 135/299 |
| 4,924,198 | 5/1990 | Laskaris | 335/216 |
| 4,935,714 | 6/1990 | Vermilyea | 335/216 |

*Primary Examiner*—Leo P. Picard
*Assistant Examiner*—Trinidad Korkc
*Attorney, Agent, or Firm*—Patrick L. Scanlon; James C. Davis, Jr.; Paul R. Webb, II

[57] ABSTRACT

An actively shielded refrigerated superconductive magnet is provided. The magnet includes a generally cylindrical vacuum vessel having an axially extending bore. A plurality of superconductive main coils are positioned in the vacuum vessel concentrically surrounding and spaced away from the bore. A pair of superconductive shield coils having a larger diameter than the superconductive main coils are situated in the vacuum vessel, concentric with the superconductive main coils. The superconductive shield coils are situated at either end of the superconductive main coils. The superconductive shield coils and the superconductive main coils are electrically connected to one another so that the superconductive shield coils and the superconductive main coils are capable of carrying current in opposite circumferential directions. A thermal shield encloses the superconductive main and shield coils, with the thermal shield spaced away from the vacuum vessel and superconductive main and shield coils. A two stage cryocooler is provided for cooling the superconductive main and shield coils, and the thermal shield.

3 Claims, 3 Drawing Sheets

ACTIVELY SHIELDED MAGNETIC RESONANCE MAGNET WITHOUT CRYOGENS

CROSS REFERENCE TO RELATED APPLICATIONS

The present invention is related to the following copending applications: Ser. No. 07/395,636, entitled "Magnet Cartridge for Magnetic Resonance Magnet"; Ser. No. 07/348,322, "Cryocooler Cold Head Interface Receptacle"; and Ser. No. 07/395,637, entitled "Refrigerated MR Magnet Support System", all assigned to the same assignee as the present invention.

BACKGROUND OF THE INVENTION

The present relates to actively shielded superconductive magnetic resonance (MR) magnets which are cooled by refrigeration without the use of consumable cryogens.

Magnetic resonance imaging magnets used in medical diagnostics employ uniform high intensity DC magnetic fields in the interior of the magnet. A stray field surrounds the magnet and can adversely affect electronic equipment near the magnet unless the electronic equipment is individually shielded or the magnet stray field is reduced. Pacemakers, for example, have been found to be affected by stray fields as low as 10 gauss, (the earth's magnetic field is 0.5 gauss), so that uncontrolled access to the areas surrounding the magnet have to be restricted.

One approach to the stray field problem has been to locate the magnet in a separate building reserved exclusively for the purpose of diagnostic imaging. This can be costly since it depends on providing additional real estate. At times, such as in crowded urban areas, it is not feasible to provide the extra space.

Another approach is to surround the room where the magnet is located with ferromagnetic sheets which act to inhibit the extent of the stray field in the room. The disadvantages to this approach are that the shielding can add up to one hundred tons to the weight of the room, usually requiring structural modifications to the building. Also any dissymmetry in the ferromagnetic material surrounding the magnet can adversely affect the homogeneity in the working volume of the magnet leading to imaging distortions.

Still another approach to the stray field problem is described in U.S. Pat. No. 4,646,045 in which the magnet is surrounded by enough ferromagnetic material to suppress the stray field. This approach has several potential disadvantages. The shield is designed for optimum operation at only one field level in the magnet and the proximity of the ferromagnetic material to the magnet makes the homogeneity of the working volume susceptible to any dissymmetry introduced during the manufacturing process.

Yet another approach is to use an actively shielded magnet, described in U.S. Pat. No. 4,587,504, issued May 6, 1986 to Brown, et al. Brown et al describes creating two homogeneous fields of different strengths using two different sets of coils, with the fields subtracting from one another thereby producing a uniform magnetic field. Active shielding in conventionally helium cooled MR magnets is not as attractive or cost effective as passive or room shielding for 1.5 Tesla (1 Tesla = 10,000 gauss) magnets since it increases the cryostat outer diameter by 50%, close to 3 meters, and doubles the magnet ampere-turns.

It is an object of the present invention to provide a low cost, lightweight actively shielded MR magnet without cryogens with about the same bore and outside diameter as a conventional helium cooled magnet of the same field strength and homogeneity.

SUMMARY OF THE INVENTION

In one aspect of the present invention, an actively shielded refrigerated superconductive magnet is provided. The magnet includes a generally cylindrical vacuum vessel having an axially extending bore. A plurality of superconductive main coils are positioned in the vacuum vessel concentrically surrounding and spaced away from the bore. A pair of superconductive shield coils having a larger diameter than the superconductive main coils are situated in the vacuum vessel, concentric with the superconductive main coils. The superconductive shield coils are situated at either end of the superconductive main coils. The superconductive shield coils and the superconductive main coils are electrically connected to one another so that the superconductive shield coils and the superconductive main coils are capable of carrying current in opposite circumferential directions. Thermal shield means enclose the superconductive main and shield coils, with the thermal shield spaced away from the vacuum vessel and superconductive main and shield coils. A two stage cryocooler is provided for cooling the superconductive main and shield coils, and the thermal shield.

BRIEF DESCRIPTION OF THE DRAWING

The subject matter which is regarded as the invention, is particularly pointed out and distinctly claimed in the concluding portion of the specification. The invention, however, both as to organization and method of practice, together with further objects and advantages thereof, may best be understood by reference to the following description taken in conjunction with the accompanying drawing figures in which:

DETAILED DESCRIPTION OF THE INVENTION

Figure 1:
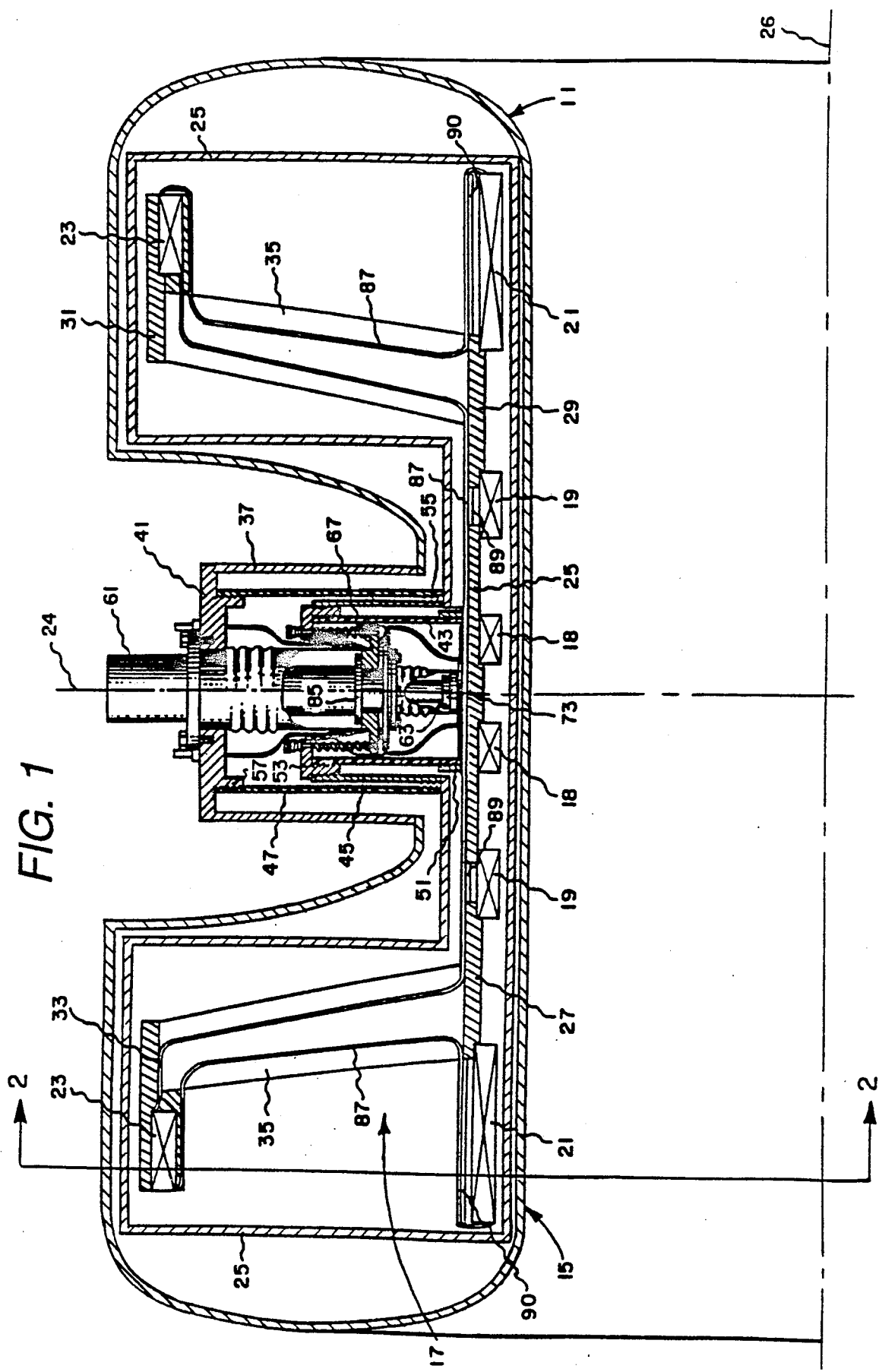
FIG. 1 is a sectional side view of an actively shielded refrigerated MR magnet from the horizontal midplane upwards, in accordance with the present invention.
Figure 2:
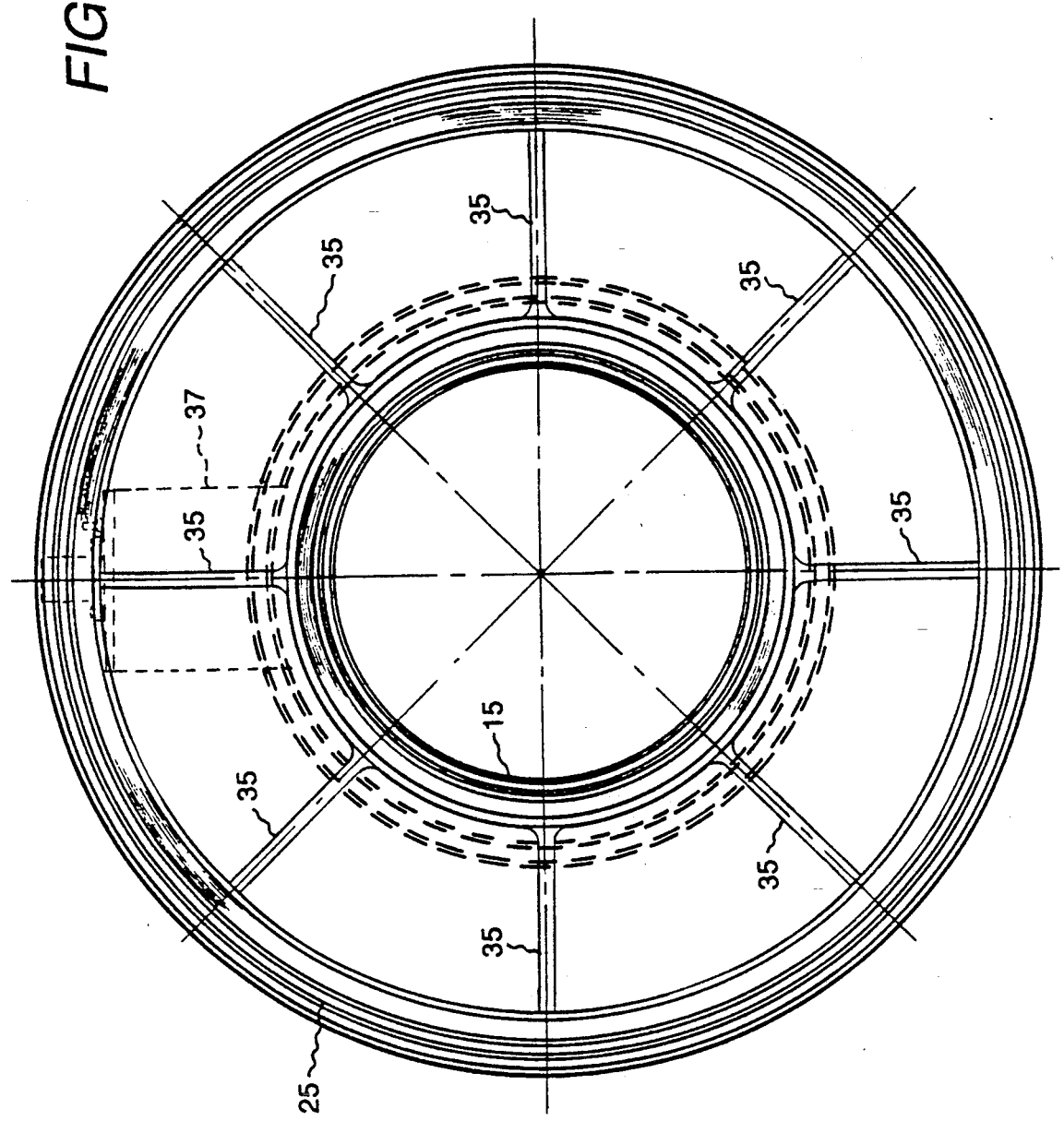
FIG. 2 is an end view of FIG. 1 along the lines 2—2.
Figure 3:
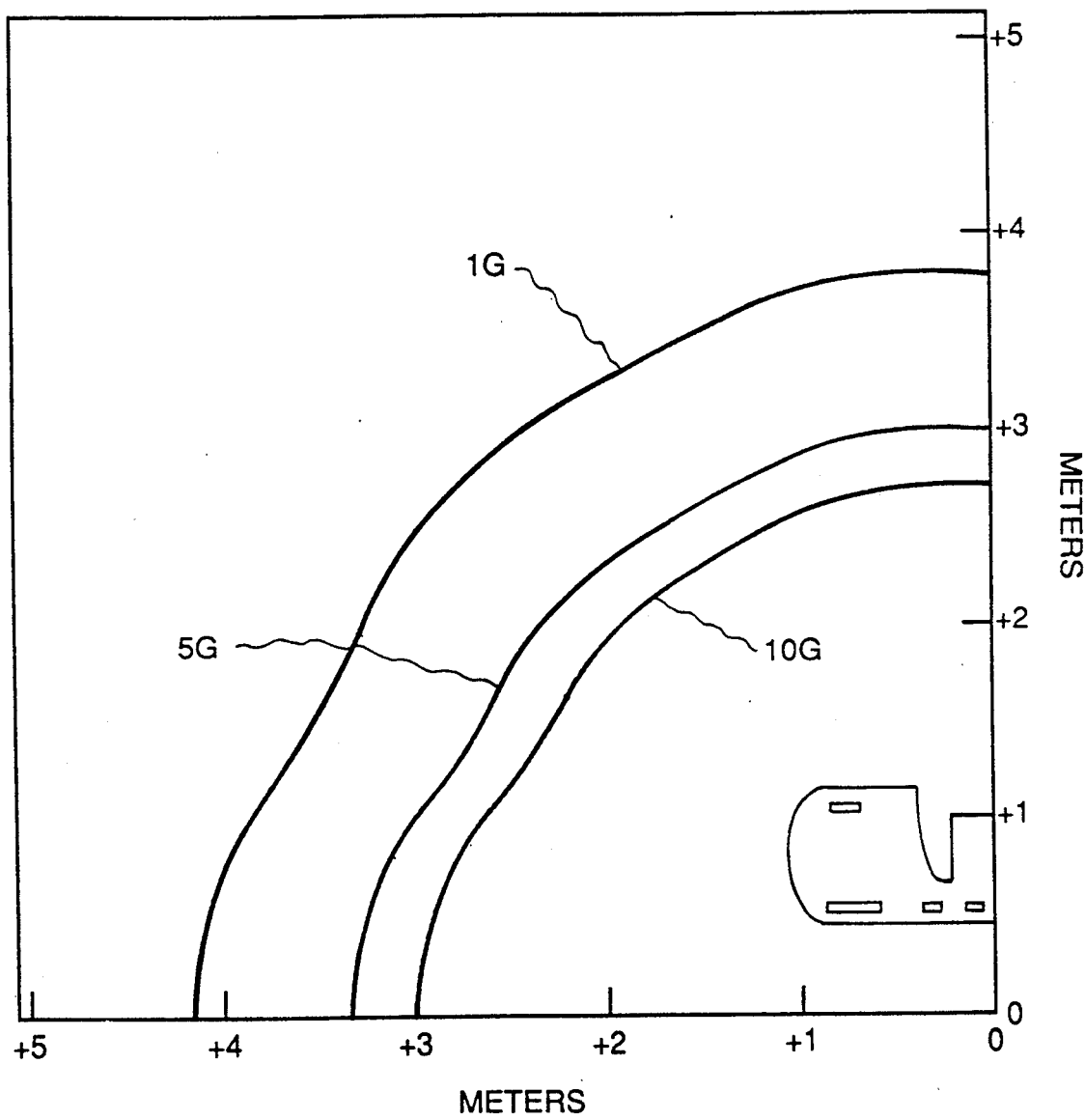
FIG. 3 is a graph showing one quadrant of the five gauss stray field contour that is contained within a room 6 meters by 7 meters long, with the ordinate axis showing the field measured from the center of the magnet radially outwardly and the abscissa showing the field measured from the center of the magnet in the axial direction.

Referring now to the drawing and particularly FIGS. 1 and 2 thereof, a generally cylindrical vacuum vessel 11 having a reduced diameter central region 13 is shown. The vacuum vessel 11 has an axially extending bore sleeve 15 which can be fabricated from stainless steel. The rest of the vacuum vessel can be fabricated from thin carbon steel or stainless steel. The annular end pieces 16 of the cylindrical vacuum vessel are preferably convex to allow thinner material to be used without deflection. Curved pieces also have the advantage of greatly reduced bending stresses allowing thinner pieces to be used. Concave shaped pieces are shown in the transition from the larger diameter portion of the vacuum vessel to the centrally located smaller diameter portion. The concave and convex shaped pieces can be formed, for example, by the metal-forming process of spinning. In spinning a symmetrical pattern and material are spun while a tool is used to force the material against the pattern deforming the material to achieve the shape of the pattern. The various sections of the vacuum vessel can be joined such as by welding.

A cylindrical magnet cartridge 17 is located concentrically inside the vessel 11, and surrounds and is spaced away from the bore sleeve 15. The magnet cartridge comprises three pair of superconductive main coils 18, 19, and 21, of nearly the same diameter, and one pair of superconductive shield coils 23, having approximately twice the diameter of the main superconductive coils. One type of magnet cartridge having six main coils is shown in copending application Ser. No. 07/395,636 entitled "Magnet Cartridge for Magnetic Resonance Magnet" which is hereby incorporated by reference. Pairs of superconductive coils 18, 19, 21 and 23 are located symmetrically about the axial midplane 24 of the magnet cartridge and are concentrically located along the same axially extending centerline 26. Each of the coils comprises a freestanding epoxy impregnated superconductive coil.

Cylindrical spacers are used to position and support the main coils relative to one another and to support and position the shield coils. In the present embodiment five spacers 25, 27, 29, 31 and 33 are used. The cylindrical spacers are preferably fabricated from rolled and welded aluminum which are stress relieved prior to machining. Copper alloys can alternatively be used. The center sleeve 25 is machined to provide an inwardly extending centrally located shoulder on the inside of the sleeve. The spacers 25, 27 and 29 are machined at either end to form a circumferentially extending rabbet at their inner diameters. The spacers 25, 27, and 29 are positioned spaced apart from one another and concentric about a common axially extending axis. The innermost pair of coils 18 are positioned inside the central spacer butting up against the centrally located shoulder on the inside of the sleeve. Positioned between the central spacer 25 and two outer spacers 27 and 29 in the rabbets are the second coil pair 19. The third pair of coils 21 are supported concentrically with the other coils in a cantilever fashion from the ends of the outer spacers 27 and 29 with the ends of the coils positioned in the rabbeted ends of the spacers. The two shield coils are situated in the larger diameter end portions of the cryocooler. Spacers 31 and 33 are machined at one end to form a circumferentially extending rabbet at their inner diameters. Shield coils 23 are epoxy-bonded in the rabbeted end of cylindrical spacers 31 and 33 with the rabbeted ends of the spaces facing away from the midplane of the vacuum vessel. The shield coils are supported by the main coils by means of radially extending stiffeners 35 affixed between spacers 27 and 33 and between spacers 29 and 31 such as by welding. Eight to twelve equally circumferentially spaced stiffeners, for example, can be used at each end, with eight stiffeners shown in FIG. 2. The spacers can be heated prior to inserting the ends of the coils to achieve a shrink fit. Each of the rabbeted joints is bonded with epoxy resin to provide low thermal contact resistance. Aluminum is the preferred material for the spacers and stiffeners because of its high thermal conductivity, strength and light weight.

Each coil in four coil pairs is helically wound with either $Nb_3Sn$ superconductive tape or superconductive wire with hardened, preferably perforated, copper closed foilloops inserted among the winding layers and a plurality of layers with intermediately placed glass cloth wound over the entire diameter of the coil, prior to epoxy impregnation. A superconductive tape epoxy impregnated coil of the type shown and claimed in copending application Ser. No. 07/395,635 entitled "Epoxy-Impregnated Superconductive Tape Coil" and hereby incorporated by reference can be used. The coils whether wound with superconductive tape or superconductive wire can be fabricated using a demountable coil form, such as the one shown and claimed in copending application Ser. No. 07/395,634 entitled "Demountable Coil Form for Epoxy Impregnated Coils" and herein incorporated by reference.

Each superconducting coil is self supported against the radially outward electromagnetic forces that occur when the coils are energized, by the hardened copper foil loops and foil overwrap. The foil overwrap is provided with a sufficient thickness so that it coincides with the portion of the coil extending into the rabbet in the sleeve. The spacers provide support only against the axially inward directed forces which attempt to force the coils to the axial midplane of the cartridge when the coils are energized. The cylindrical spacers locate the coils precisely relative to one another.

The magnet cartridge of main and shield coils 17 is surrounded by a cylindrical thermal shield 25 which encloses the magnet cartridge but is spaced away therefrom.

The vacuum vessel has a cylindrical extension 37 which protrudes radially outwardly from the reduced diameter portion of the vacuum vessel 11. The cylindrical extension has an annular shaped cover 41. The central axis of the extension lies on a radial line extending from the cylindrical vacuum vessel on the midplane of the vacuum vessel. The cylindrical extension and cover can be fabricated from carbon steel or stainless steel.

The magnet cartridge 17 is supported inside the vacuum vessel 11 by three concentric thin wall tubes 43, 45, and 47. The innermost tube 43 has external threads on either end and is fabricated from a material which is a good thermal insulator at cryogenic temperatures, such as G-10 epoxy resin bonded glass cloth. The innermost tube 43 is secured to the magnet cartridge by means of an internally threaded collet which is secured to the magnet cartridge. The collet 51 can be fabricated from a material such as aluminum. One end of the innermost tube is secured to the collet 51 by an epoxy-bonded threaded joint. Applying epoxy resin to the parts prior to threading them together results in a joint with good mechanical strength and no relative motion. The epoxy bonded threaded joint also results in a low thermal contact resistance which is useful when the sleeve is providing thermal coupling between two components. This support system is shown and claimed in copending application Ser. No. 07/395,637, entitled "Refrigerated MR Magnet Support System", hereby incorporated by reference.

The other end of the innermost tube is epoxy-bonded threaded in a collet 53 which has interior and exterior threads and an inwardly extending flange.

The intermediate tube 45 has internal threads on one end and external threads on the other and is fabricated from a high thermal conductivity material such as aluminum. The end of the tube with the internal threads forms an epoxybonded threaded joint with the exterior threads of collet 53. The externally threaded end of the intermediate tube 45 is connected to a ring 55 having internal and external threads and secured to thermal shield 25. The ring surrounds an opening in the thermal shield. The ring 55 and thermal shield 25 can be fabricated from aluminum, for example, and welded together.

The annular cover plate 41 closing off the cylindrical vacuum vessel extension includes a threaded nipple portion 57 on the inner surface of the cover. The threaded nipple and ring 55 are of the same diameter and are concentric with one another. The outer tube 47 is fabricated from a thermally insulating material such as G-10 and is joined between the external threads of the ring and the nipple by epoxy-bonded threaded joints.

The suspension system in addition to supporting the weight of the magnet cartridge must support the load imposed by the first and second stages of the cryocooler cold end pressing down on the first and second stage heat stations 67 and 73, respectively. The magnet cartridge is supported close to where the load is imposed by the end of the cryocooler, reducing bending stresses on the magnet cartridge. The inner tube 43, which is under tension, in addition to transferring the load of the magnet cartridge weight, as well as the force exerted on the magnet cartridge by the second stage cold end of the cryocooler, thermally insulates the magnet cartridge from the thermal radiation shield 25. The magnet cartridge and thermal radiation shield can operate at 10K and 50K, respectively.

The aluminum intermediate tube 45 which is subjected to a compressive load, in addition to transferring the load from the inner tube 43 to the ring 55 also transmits the load of the first stage of the cryocooler on the first stage heat station 67. The intermediate tube 45 thermally couples the heat shield 25 to the first stage of the cryocooler 85.

The outside tube 47 thermally insulates the thermal radiation shield 25 from the vacuum vessel 11 and transfers the load of the cryocooler interface, magnet cartridge, and shield to the vacuum vessel.

The electrical leads are heat stationed as claimed and described in copending application Ser. No. 215,131, filed July 5, 1988 entitled "Efficient Thermal Joints for Connecting Current Leads to a Cryocooler", and hereby incorporated by reference. The main coils and shield coils are all connected in series with the shield coils carrying current in a direction opposite to the current in the main field coils. Bus bars 87 insulated from the cylindrical spacers connect the shield coils to the main coils. Bridge pieces of insulating material 89 are used between the spacers to provide support for the bus bars and to limit their movement. A cantilivered bridge piece 90 is used to support the bus bar carrying current to main coil. In one embodiment, calculated values for the coil positions, coil dimensions, and current densities for a 1.5 Tesla shielded magnet are shown in the table below. The values are for one half of the coil pairs positioned on one side of the magnet, with measurements made from the center of the bore.

|  | Coil 18 | Coil 19 | Coil 21 | Coil 23 |
| --- | --- | --- | --- | --- |
| Coil Center Coordinates in Centimeters |  |  |  |  |
| Radial | 52.1 | 52.2 | 51.9 | 100 |
| Axial | 8.3 | 28 | 65.2 | 69 |
| Coil Width in Centimeters |  |  |  |  |
| Radial | 3.4 | 3.4 | 3.4 | 3.4 |
| Axial | 7 | 10 | 27.4 | 12.4 |
| Ampere-Turns | 254,000 | 373,000 | 1,017,000 | -445,000 |
| Current Density $\left(\frac{\text{Ampere-Turns}}{\text{meter}^2}\right)$ | 106,700,000 | 109,000,000 | 105,500,000 | -105,600,000 |

In a refrigerated MR magnet without cryogens the main coil diameter can be reduced in comparison with a conventional helium cooled magnet because the helium vessel and surrounding thermal shield are eliminated. Consequently an active shield of about 2 meters in diameter can be placed around the main coils to reduce the stray field to 5 gauss about 3 meters from the magnet center with only 35% higher ampere-turns for the actively shielded magnet as compared to a conventional helium cooled magnet of the same field strength and clear bore diameter.

The foregoing has described a refrigerated MR magnet support system that has no sliding contacts at the interface with magnet cartridge or the vacuum vessel.

While the invention has been particularly shown and described with reference to an embodiment thereof, it will be understood by those skilled in the art that various changes in form and detail may be made without departing from the spirit and scope of the invention.

What is claimed is:

1. An actively shielded refrigerated superconductive magnet comprising:
    a generally cylindrical vacuum vessel having an axially extending bore;
    a plurality of superconductive main coils in said vacuum vessel concentrically surrounding and spaced away from said bore;
    a pair of superconductive shield coils situated in said vacuum vessel, concentric with the superconductive main coils and having a larger diameter than the superconductive main coils, said superconductive shield coils situated at either end of the superconductive main coils, said superconductive shield coils and said superconductive main coils electrically connected to one another so that the superconductive shield coils and the superconductive main coils are capable of carrying current in opposite circumferential directions;
    thermal shield means enclosing said superconductive main and shield coils, said thermal shield spaced away from said vacuum vessel; and two stage cryocooler means for cooling said superconductive main and shield coils, and said thermal shield.

2. The actively shielded refrigerated superconductive magnet of claim 1 wherein said superconductive shield coils are approximately twice the diameter of the superconductive main coils.

3. The actively shielded refrigerated superconductive magnet of claim 2 wherein each superconductive main coil and superconductive shield coil comprises an epoxy-impregnated free standing coil, said superconductive main coils separated and supported by main coil cylindrical sleeves of thermally conductive material, each of said superconductive shield coils supported by a shield coil cylindrical sleeve of thermally conductive material, each of said superconductive shield coils and shield coil cylindrical sleeves supported from the main coil cylindrical sleeves by a plurality of radially extending thermally conducting supports.

* * * * *